United States Patent
Shiraokawa et al.

(10) Patent No.: US 12,363,826 B2
(45) Date of Patent: Jul. 15, 2025

(54) COPPER-CLAD LAMINATE, PRINTED WIRING BOARD, SEMICONDUCTOR PACKAGE AND METHOD FOR PRODUCING COPPER-CLAD LAMINATE

(71) Applicant: Showa Denko Materials Co., Ltd., Tokyo (JP)

(72) Inventors: Yoshikatsu Shiraokawa, Tokyo (JP); Shinichi Kamoshida, Tokyo (JP); Hiroshi Kurokawa, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 709 days.

(21) Appl. No.: 17/260,909

(22) PCT Filed: Jul. 17, 2019

(86) PCT No.: PCT/JP2019/028081
§ 371 (c)(1),
(2) Date: Jan. 15, 2021

(87) PCT Pub. No.: WO2020/017551
PCT Pub. Date: Jan. 23, 2020

(65) Prior Publication Data
US 2021/0267052 A1    Aug. 26, 2021

(30) Foreign Application Priority Data
Jul. 18, 2018    (JP) ................... 2018-135318

(51) Int. Cl.
*H05K 1/03*    (2006.01)
*B32B 15/08*    (2006.01)
*B32B 15/20*    (2006.01)
*C25D 11/38*    (2006.01)

(52) U.S. Cl.
CPC .......... *H05K 1/0353* (2013.01); *B32B 15/08* (2013.01); *B32B 15/20* (2013.01); *C25D 11/38* (2013.01); *B32B 2255/06* (2013.01); *B32B 2457/08* (2013.01)

(58) Field of Classification Search
CPC ..... B32B 15/08; B32B 15/20; B32B 2255/06; B32B 2457/08; H05K 1/0353; C25D 11/38
See application file for complete search history.

(56) References Cited

U.S. PATENT DOCUMENTS

| | | | |
|---|---|---|---|
| 2007/0154692 A1* | 7/2007 | Suzuki | ..................... C25D 5/10 428/209 |
| 2013/0220679 A1* | 8/2013 | Kawakami | ............. H05K 3/025 428/606 |
| 2016/0374205 A1* | 12/2016 | Moriyama | ............. H05K 3/384 |
| 2017/0042025 A1* | 2/2017 | Miyamoto | .............. B32B 15/08 |
| 2017/0213745 A1* | 7/2017 | Kato | ..................... H05K 3/0058 |
| 2018/0160529 A1 | 6/2018 | Arai et al. | |
| 2019/0023899 A1* | 1/2019 | Tanigawa | ................ C08L 79/08 |

FOREIGN PATENT DOCUMENTS

| | | | | |
|---|---|---|---|---|
| CN | 1925982 A | 3/2007 | | |
| CN | 102713020 A | 10/2012 | | |
| CN | 104943270 A | 9/2015 | | |
| CN | 106257969 A | 12/2016 | | |
| CN | 108156753 A | 6/2018 | | |
| JP | 2010-201620 A | 9/2010 | | |
| JP | 2013-062441 A | 4/2013 | | |
| JP | 2013-075948 A | 4/2013 | | |
| JP | 2017-007327 A | 1/2017 | | |
| JP | 2018-090903 A | 6/2018 | | |
| KR | 2015-0111313 A | 10/2015 | | |
| WO | 2009/008471 A1 | 1/2009 | | |
| WO | WO-2011105318 A1 * | 9/2011 | ............. | H05K 3/382 |
| WO | WO-2019188837 A1 * | 10/2019 | ............. | B32B 15/20 |

* cited by examiner

*Primary Examiner* — Nathan Milakovich
(74) *Attorney, Agent, or Firm* — FITCH, EVEN, TABIN & FLANNERY, LLP

(57) ABSTRACT

Provided are a copper-clad laminate including an insulating layer containing a resin and a copper foil arranged on at least one surface of the insulating layer, wherein the copper foil is a surface-treated copper foil having a metal-treated layer containing zinc, and a content of zinc in the metal-treated layer is 10 to 2,500 µg/dm$^2$; a method for producing the copper-clad laminate; and a printed wiring board and a semiconductor package using the copper-clad laminate.

12 Claims, No Drawings

COPPER-CLAD LAMINATE, PRINTED WIRING BOARD, SEMICONDUCTOR PACKAGE AND METHOD FOR PRODUCING COPPER-CLAD LAMINATE

CROSS-REFERENCE TO RELATED APPLICATIONS

This application is a U.S. national phase application filed under 35 U.S.C. § 371 of International Application No. PCT/JP2019/028081, filed Jul. 17, 2019, designating the United States, which claims priority from Japanese Application No. 2018-135318, filed Jul. 18, 2018, which are hereby incorporated herein by reference in their entirety.

TECHNICAL FIELD

The present invention relates to a copper-clad laminate, a printed wiring board, a semiconductor package, and a method for producing the copper-clad laminate.

BACKGROUND ART

With recent miniaturization and high performance of electronic devices, printed wiring boards have been developed to have higher wiring density and higher integration, and accordingly there has been an increasing demand for improvement in reliability of copper-clad laminates for printed wiring boards.

The copper-clad laminate is obtained by laminating an insulating layer and a copper foil, and is generally produced by laminating a prepreg obtained by impregnating a glass cloth with a resin and a copper foil, and heating and pressurizing the laminate. The obtained copper-clad laminate is then subjected to heat treatment such as annealing treatment and reflow treatment after a circuit is formed, and a printed wiring board using the copper-clad laminate is produced.

As described above, in the production process of a printed wiring board, a plurality of heat treatments are performed in a state where an insulating layer such as a prepreg and a copper foil are laminated. At this time, swelling (hereinafter also referred to as "blister") may occur between the insulating layer and the copper foil. Since the blister causes deterioration in yield of the copper-clad laminate, deterioration in reliability of the printed wiring board, and the like, it is desired to suppress the occurrence of the blister.

In particular, in recent years, from the viewpoint of global environmental protection, the use of lead-free solder has progressed, and the temperature of the reflow process at the time of mounting components on a printed wiring board and at the time of assembling a semiconductor package has become extremely high. In addition, the heating temperature at the time of lamination molding is sometimes increased for the purpose of improving production efficiency and the heat history imparted to the copper-clad laminate is becoming increasingly severe, and there is an increasing demand for increasing the blister resistance of the copper-clad laminate.

Various studies have been conducted for the purpose of improving blister resistance of the copper-clad laminate.

For example, PTL 1 discloses a printed circuit board in which a metal wall portion is formed on at least one of peripheral edge portions of the printed circuit board for the purpose of suppressing entry of moisture which causes blisters from a side surface of the printed circuit board during reflow.

In addition, PTL 2 discloses a method for producing a cured product in which an epoxy resin material containing an epoxy resin, an active ester compound, and a curing accelerator is used, and the epoxy resin material is cured in an inert gas atmosphere, as a method for producing a cured product capable of suppressing the occurrence of blisters when exposed to high temperatures.

CITATION LIST

Patent Literature

PTL 1: JP 2013-062441 A
PTL 2: JP 2013-075948 A

SUMMARY OF INVENTION

Technical Problem

However, in the printed circuit board described in PTL 1, it is necessary to form a metal wall portion in the peripheral edge portion, and there is a problem in that the degree of freedom in design of the printed circuit board is restricted.

In addition, in the method for producing a cured product described in PTL 2, the epoxy resin material needs to be cured in an inert gas atmosphere, and there is a problem in that productivity and handling property are poor.

The present invention has been made in view of the above circumstances, and an object of the present invention is to provide a copper-clad laminate in which generation of blisters is suppressed, a method for producing the copper-clad laminate, and a printed wiring board and a semiconductor package using the copper-clad laminate.

Solution to Problem

As a result of intensive studies to solve the above problems, the present inventors have found that the above problems can be solved by the present invention described below, and have completed the present invention.

The present invention relates to the following [1] to [9].

[1] A copper-clad laminate including an insulating layer containing a resin and a copper foil arranged on at least one surface of the insulating layer, wherein the copper foil is a surface-treated copper foil having a metal-treated layer containing zinc, and a content of zinc in the metal-treated layer is 10 to 2,500 µg/dm$^2$.

[2] The copper-clad laminate according to [1], wherein the metal-treated layer further contains one or more metals selected from the group consisting of nickel, cobalt, and molybdenum.

[3] The copper-clad laminate according to [2], wherein a total content of one or more metals selected from the group consisting of nickel, cobalt, and molybdenum in the metal-treated layer is 10 to 2,500 µg/dm$^2$.

[4] The copper-clad laminate according to any one of [1] to [3], wherein the metal-treated layer further contains nickel, and a content of nickel in the metal-treated layer is 10 to 200 µg/dm$^2$.

[5] The copper-clad laminate according to any one of [1] to [4], wherein the content of zinc in the metal-treated layer is 10 to 500 µg/dm$^2$.

[6] The copper-clad laminate according to any one of [1] to [5], wherein the surface-treated copper foil is obtained by subjecting one surface or both surfaces of a copper foil to heat resistance treatment, chromate treatment, and silane coupling agent treatment.

[7] A method for producing the copper-clad laminate according to any one of [1] to [6], wherein the insulating layer is a layer obtained by curing a prepreg containing a thermosetting resin, and the method includes heating the prepreg or the insulating layer obtained by curing the prepreg and the surface-treated copper foil at 210° C. or higher in a state where the prepreg or the insulating layer obtained by curing the prepreg and the surface-treated copper foil are bonded to each other.

[8] A printed wiring board including the copper-clad laminate according to any one of [1] to [6].

[9] A semiconductor package including a semiconductor element mounted on the printed wiring board according to [8].

Advantageous Effects of Invention

According to the present invention, it is possible to provide a copper-clad laminate in which generation of blisters is suppressed, a method for producing the copper-clad laminate, and a printed wiring board and a semiconductor package using the copper-clad laminate.

DESCRIPTION OF EMBODIMENTS

In the numerical ranges described in this description, the upper limit value or the lower limit value of the numerical range may be replaced with a value shown in Examples. In addition, the lower limit value and the upper limit value of the numerical range are arbitrarily combined with the lower limit value and the upper limit value of another numerical range, respectively.

In addition, unless otherwise specified, each component and material exemplified in this description may be used alone or in combination of two or more kinds thereof. In the description herein, when a plurality of substances corresponding to each component are present in the composition, the content of each component in the composition means the total amount of the plurality of substances present in the composition unless otherwise specified.

Embodiments in which the items described in this description are arbitrarily combined are also included in the present invention.

[Copper-Clad Laminate]

The copper-clad laminate of the present embodiment is a copper-clad laminate including an insulating layer containing a resin (hereinafter also simply referred to as an "insulating layer") and a copper foil arranged on at least one surface of the insulating layer, wherein the copper foil is a surface-treated copper foil having a metal-treated layer containing zinc, and a content of zinc in the metal-treated layer is 10 to 2,500 $\mu g/dm^2$.

In the following description, the surface-treated copper foil having a metal-treated layer with a zinc content of 10 to 2,500 $\mu g/dm^2$ included in the copper-clad laminate of the present embodiment is also referred to as "surface-treated copper foil (I)".

The structure of the copper-clad laminate of the present embodiment is not particularly limited as long as it includes a structure in which an insulating layer and a surface-treated copper foil (I) are arranged on at least one surface of the insulating layer.

When the copper-clad laminate of the present embodiment includes two or more copper foils, the two or more copper foils may be only the surface-treated copper foil (I), or may be a combination of the surface-treated copper foil (I) and a copper foil other than the surface-treated copper foil (I).

As the structure of the copper-clad laminate, a copper foil may be laminated on one or both surfaces of the insulating layer, or one or more insulating layers and one or more copper foils may be alternately formed. Alternatively one or more insulating layers and one or more copper foils may be alternately formed on one or both surfaces of a core substrate having copper foils on both surfaces.

The number of insulating layers included in the copper-clad laminate of the present embodiment may be one or more, and may be appropriately selected from, for example, 2 to 20, depending on the application.

The number of copper foils included in the copper-clad laminate of the present embodiment is one or more, and may be appropriately selected from, for example, 2 to 20, depending on the application.

Furthermore, the copper foil included in the copper-clad laminate of the present embodiment may have a circuit formed by a method described later.

In the above description, the term "copper foil" refers to "surface-treated copper foil (I)" when the copper-clad laminate includes only "surface-treated copper foil (I)", and to both "surface-treated copper foil (I)" and "copper foil other than surface-treated copper foil (I)" when the copper-clad laminate includes "surface-treated copper foil (I)" and "copper foil other than surface-treated copper foil (I)".

The thickness of the copper-clad laminate of the present embodiment is not particularly limited and may be appropriately determined according to the application of the copper-clad laminate, and is, for example, 0.03 to 1.6 mm.

Next, the surface-treated copper foil (I) and the insulating layer included in the copper-clad laminate of the present embodiment will be described.

<Surface-Treated Copper Foil (I)>

The surface-treated copper foil (I) included in the copper-clad laminate of the present embodiment has a metal-treated layer containing zinc on at least one surface.

Here, the metal-treated layer formed on the surface of the copper foil may have a metal-treated layer containing zinc on at least one surface, and the purpose of forming the metal-treated layer is not particularly limited. That is, the metal-treated layer may be formed by, for example, heat resistance treatment for the purpose of improving heat resistance, weather resistance, or the like, or may be formed by chromate treatment or the like for the purpose of improving rust prevention. In addition, the metal-treated layer may be formed by both heat resistance treatment and chromate treatment, or may be formed by other treatments.

The content of zinc in the metal-treated layer is 10 to 2,500 $\mu g/dm^2$, preferably 15 to 1,000 $\mu g/dm^2$, more preferably 20 to 500 $\mu g/dm^2$, still more preferably 25 to 300 $\mu g/dm^2$, and particularly preferably 30 to 200 $\mu g/dm^2$.

When the content of zinc in the metal-treated layer is the above lower limit value or more, a sufficient rust prevention effect is obtained and the fine wiring property is excellent, and when the content is the above upper limit value or less, the blister resistance is excellent.

In the description herein, the content of the specific element in the metal-treated layer means the content of the specific element in one metal-treated layer. Therefore, when the surface-treated copper foil (I) has metal-treated layers on both surfaces, the content of the specific element in the metal-treated layer means the content of the specific element in the metal-treated layer on one surface among the metal-treated layers on both surfaces.

The metal-treated layer preferably contains, in addition to zinc, one or more metals selected from the group consisting of nickel, cobalt, and molybdenum (hereinafter, also referred to as "second metal", and when two or more elements are contained as the second metal, these two or more elements are also referred to as "second metal"), and more preferably contains nickel. When the metal-treated layer contains the second metal, the obtained copper-clad laminate is further excellent in blister resistance.

When the metal-treated layer contains the second metal, the total content of the second metal in the metal-treated layer is preferably 10 to 2,500 µg/dm$^2$, more preferably 40 to 1,000 µg/dm$^2$, still more preferably 60 to 500 µg/dm$^2$, and particularly preferably 100 to 300 µg/dm$^2$.

When the metal-treated layer contains nickel as the second metal, the content of nickel in the metal-treated layer is preferably 10 to 500 µg/dm$^2$, more preferably 40 to 400 µg/dm$^2$, still more preferably 60 to 300 µg/dm$^2$, and particularly preferably 100 to 200 µg/dm$^2$.

When the metal-treated layer contains the second metal, the ratio [second metal/zinc] of the content of zinc in the metal-treated layer to the total content of the second metal is preferably 0.1 to 20, more preferably 0.5 to 10, still more preferably 1.0 to 5, and particularly preferably 1.2 to 2, in terms of mass ratio, from the viewpoint of further improving blister resistance.

The contents of zinc and the second metal in the metal-treated layer can be measured by fluorescent X-ray analysis.

The copper foil included in the copper-clad laminate of the present embodiment is not particularly limited, and may be a rolled copper foil or an electrolytic copper foil, but is preferably an electrolytic copper foil.

At least one surface of the surface-treated copper foil (I) may be subjected to a roughening treatment.

The method and conditions for the roughening treatment may be appropriately selected from conventionally known methods and conditions according to the required surface properties, and examples thereof include a method of attaching a film having fine irregularities to the surface of a copper foil by electroplating of copper or the like. Before the roughening treatment, pretreatment such as acid cleaning may be appropriately performed.

When the surface-treated copper foil (I) is subjected to the roughening treatment, the surface-treated layer may be provided on either or both of the roughened surface and the non-roughened surface, and is preferably provided on the roughened surface.

At least a part of the metal-treated layer of the surface-treated copper foil (I) of the present embodiment is preferably formed by heat resistance treatment.

The heat resistance treatment preferably includes a plating treatment using zinc. The plating treatment using zinc may be either a zinc plating treatment or a zinc alloy plating treatment, and is preferably a zinc alloy plating treatment.

In the case of the zinc alloy plating treatment, examples of the metal forming an alloy with zinc include the same metals as the second metal described above. Specific examples of the zinc alloy include a zinc-nickel alloy a zinc-cobalt alloy a zinc-molybdenum alloy and a zinc-cobalt-molybdenum alloy and among these, a zinc-nickel alloy and a zinc-cobalt-molybdenum alloy are preferable.

Suitable ranges of the contents and the content ratio of zinc and the second metal in the metal-treated layer formed by the zinc plating treatment or the zinc alloy plating treatment are as described above.

At least a part of the metal-treated layer of the surface-treated copper foil (I) of the present embodiment may be formed by chromate treatment (rust prevention treatment). By performing the chromate treatment, oxidation of the copper foil can be suppressed, and fine wiring can be favorably formed at the time of circuit formation. The chromate treatment may be either an electrolytic chromate treatment or an immersion chromate treatment, but the electrolytic chromate treatment is preferable from the viewpoint of the stability of the adhesion amount.

The surface-treated copper foil (I) may be further subjected to a silane coupling agent treatment. This can improve moisture resistance, chemical resistance, adhesion to the insulating layer, and the like. The silane coupling agent treatment can be performed by, for example, appropriately diluting the silane coupling agent, applying the silane coupling agent to the copper foil, and drying the silane coupling agent. The silane coupling agent can be appropriately selected from known silane coupling agents according to desired characteristics.

The surface-treated copper foil (I) is preferably subjected to the above-described heat resistance treatment, chromate treatment, and silane coupling agent treatment.

The thickness of the surface-treated copper foil (I) may be appropriately determined in accordance with the application of the copper-clad laminate, and the like, and is, for example, preferably 1 to 120 µm, more preferably 2 to 60 µm, and still more preferably 3 to 40 µm. From the viewpoint of further reducing the thickness of the semiconductor package, the thickness is preferably 35 µm or less, more preferably 20 µm or less, and still more preferably 15 µm or less.

<Insulating Layer>

The insulating layer containing a resin, included in the copper-clad laminate of the present embodiment is not particularly limited, and may be appropriately selected from conventionally known insulating resin materials according to desired characteristics.

The insulating layer preferably contains a cured product of a thermosetting resin composition, and more preferably is a cured product of a prepreg obtained by impregnating a sheet-shaped reinforcing substrate such as a glass cloth with a thermosetting resin composition.

The thermosetting resin composition is not particularly limited as long as it contains a thermosetting resin.

Examples of the thermosetting resin include a maleimide compound, an epoxy resin, a phenol resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, and a melamine resin. One of the thermosetting resins may be used singly or two or more thereof may be used in combination. Among these, a maleimide compound and an epoxy resin are preferable from the viewpoint of heat resistance, moldability, and electrical insulation.

The thermosetting resin composition preferably contains (A) a maleimide compound, and more preferably further contains one or more selected from the group consisting of (B) an epoxy resin, (C) a copolymer resin having a structural unit derived from a substituted vinyl compound and a structural unit derived from a maleic anhydride, (D) an inorganic filler, (E) a curing agent, (F) a thermoplastic elastomer, and (G) a curing accelerator, from the viewpoint of further enhancing blister resistance and obtaining excellent copper foil adhesion, low thermal expansion, dielectric characteristics, and the like.

Hereinafter, preferred embodiments of each component will be described in detail.

[(A) Maleimide Compound]

The maleimide compound (A) is a maleimide compound having at least two N-substituted maleimide groups (a1) (hereinafter also referred to as "maleimide compound (a1)").

Examples of the maleimide compound (a1) include a maleimide compound having an aliphatic hydrocarbon group between any two maleimide groups of a plurality of maleimide groups (provided that an aromatic hydrocarbon group is not present) (hereinafter also referred to as "aliphatic hydrocarbon group-containing maleimide") and a maleimide compound having an aromatic hydrocarbon group between any two maleimide groups of a plurality of maleimide groups (hereinafter also referred to as "aromatic hydrocarbon group-containing maleimide"). Among these, an aromatic hydrocarbon group-containing maleimide is preferable from the viewpoint of high heat resistance, low relative permittivity, high copper foil adhesion, and the like.

From the same viewpoint, the maleimide compound (a1) is preferably a maleimide compound having two to five N-substituted maleimide groups in one molecule, more preferably a maleimide compound having two N-substituted maleimide groups in one molecule, still more preferably an aromatic hydrocarbon group-containing maleimide represented by any one of the following general formulae (a1-1) to (a1-4), and particularly preferably an aromatic hydrocarbon group-containing maleimide represented by the following general formula (a1-2).

One of the maleimide compounds (A) may be used singly or two or more thereof may be used in combination.

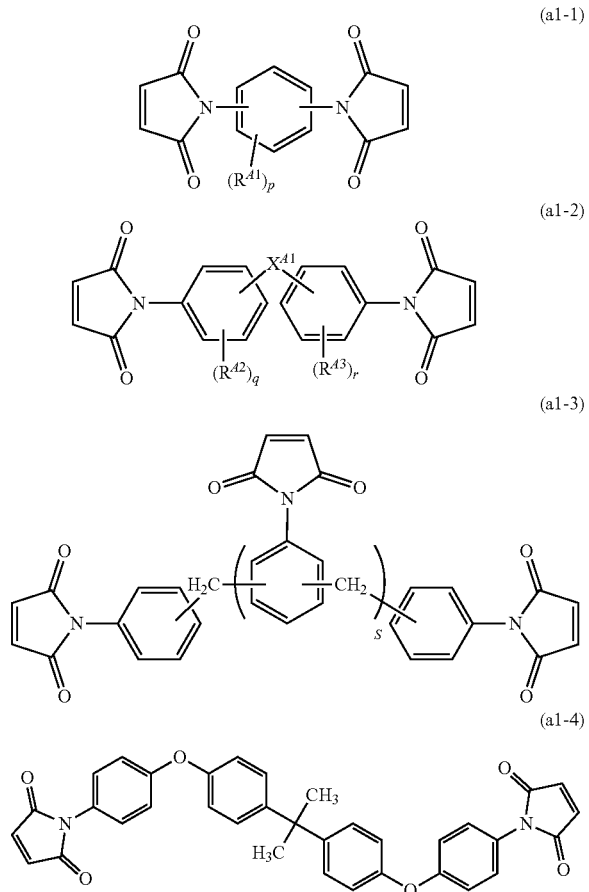

In the formulae, $R^{41}$ to $R^{43}$ each independently represent an aliphatic hydrocarbon group having 1 to 5 carbon atoms. $X^{41}$ represents an alkylene group having 1 to 5 carbon atoms, an alkylidene group having 2 to 5 carbon atoms, —O—, —C(=O)—, —S—, —S—S—, or a sulfonyl group. p, q, and r each independently represent an integer of 0 to 4. s represents an integer of 0 to 10.

Examples of the aliphatic hydrocarbon group having 1 to 5 carbon atoms, as represented by $R^{41}$ to $R^{43}$, include a methyl group, an ethyl group, an n-propyl group, an isopropyl group, an n-butyl group, an isobutyl group, a t-butyl group, and an n-pentyl group. The aliphatic hydrocarbon group is, from the viewpoint of high heat resistance, low relative permittivity, high copper foil adhesion, and the like, preferably an aliphatic hydrocarbon group having 1 to 3 carbon atoms, and more preferably a methyl group or an ethyl group.

Examples of the alkylene group having 1 to 5 carbon atoms, as represented by $X^{41}$, include a methylene group, a 1,2-dimethylene group, a 1,3-trimethylene group, a 1,4-tetramethylene group, and a 1,5-pentamethylene group. The alkylene group is, from the viewpoint of high heat resistance, low relative permittivity, high copper foil adhesion, and the like, preferably an alkylene group having 1 to 3 carbon atoms, and more preferably a methylene group.

Examples of the alkylidene group having 2 to 5 carbon atoms, as represented by $X^{41}$, include an ethylidene group, a propylidene group, an isopropylidene group, a butylidene group, an isobutylidene group, a pentylidene group, and an isopentylidene group. Among these, from the viewpoint of high heat resistance, low relative permittivity, and high copper foil adhesion, an isopropylidene group is preferable.

Among the above-mentioned choices, $X^{41}$ is preferably an alkylene group having 1 to 5 carbon atoms or an alkylidene group having 2 to 5 carbon atoms. More preferred ones are as mentioned above.

p, q, and r each independently represent an integer of 0 to 4, and from the viewpoint of high heat resistance, low relative permittivity, high copper foil adhesion, and the like, preferably an integer of 0 to 2, more preferably 0 or 1, and still more preferably 0.

s represents an integer of 0 to 10, and from the viewpoint of easy availability, preferably an integer of 0 to 5, and more preferably an integer of 0 to 3.

Specifically examples of the maleimide compound (a1) include an aliphatic hydrocarbon group-containing maleimide such as N,N'-ethylenebismaleimide, N,N'-hexamethylenebismaleimide, bis(4-maleimidecyclohexyl)methane, and 1,4-bis(maleimidemethyl)cyclohexane; and an aromatic hydrocarbon group-containing maleimide such as N,N'-(1,3-phenylene)bismaleimide, N,N'-[1,3-(2-methylphenylene)]bismaleimide, N,N'-[1,3-(4-methylphenylene)]bismaleimide, N,N'-(1,4-phenylene)bismaleimide, bis(4-maleimidephenyl)methane, bis(3-methyl-4-maleimidephenyl)methane, 3,3'-dimethyl-5,5'-diethyl-4,4'-diphenylmethanebismaleimide, bis(4-maleimidephenyl)ether, bis(4-maleimidephenyl)sulfone, bis(4-maleimidephenyl)sulfide, bis(4-maleimidephenyl)ketone, 1,4-bis(4-maleimidephenyl)cyclohexane, 1,4-bis(maleimidemethyl)cyclohexane, 1,3-bis(4-maleimidephenoxy)benzene, 1,3-bis(3-maleimidephenoxy)benzene, bis[4-(3-maleimidephenoxy)phenyl]methane, bis[4-(4-maleimidephenoxy)phenyl]methane, 1,1-bis[4-(3-maleimidephenoxy)phenyl]ethane, 1,1-bis[4-(4-maleimidephenoxy)phenyl]ethane, 1,2-bis[4-(3-maleimidephenoxy)phenyl]ethane, 1,2-bis[4-(4-maleimidephenoxy)phenyl]ethane, 2,2-bis[4-(3- maleimidephenoxy)phenyl]propane, 2,2-bis[4-(4-maleimidephenoxy)phenyl]propane, 2,2-bis[4-(3-maleimidephenoxy)phenyl]butane, 2,2-bis[4-(4-maleimidephenoxy)phenyl]butane, 2,2-bis[4-(3-maleimidephenoxy)phenyl]-1,1,1,3,3,3-hexafluoropropane, 2,2-bis[4-(4-maleimidephenoxy)phenyl]-1,1,1,3,3,3-hexafluoropropane, 4,4'-bis(3-maleimidephenoxy)biphenyl, 4,4'-bis(4-maleimidephenoxy)biphenyl, bis[4-(3-maleimidephenoxy)phenyl]ketone, bis[4-(4-maleimidephenoxy)phenyl]ketone, bis(4-maleimidephenyl)disulfide, bis[4-(3-maleimidephenoxy)phenyl]sulfide, bis[4-(4-maleimidephenoxy)phenyl]sulfide, bis[4-(3-maleimidephenoxy)phenyl]sulfoxide, bis[4-(4-maleimidephenoxy)phenyl]sulfoxide, bis[4-(3-maleimidephenoxy)phenyl]sulfone, bis[4-(4-maleimidephenoxy)phenyl]sulfone, bis[4-(3-maleimidephenoxy)phenyl]ether, bis[4-(4-maleimidephenoxy)phenyl]ether, 1,4-bis[4-(4-maleimidephenoxy)-α,α-dimethylbenzyl]benzene, 1,3-bis[4-(4-maleimidephenoxy)-α,α-dimethylbenzyl]benzene, 1,4-bis[4-(3-maleimidephenoxy)-α,α-dimethylbenzyl]benzene, 1,3-bis[4-(3-maleimidephenoxy)-α,α-dimethylbenzyl]benzene, 1,4-bis[4-(4-maleimidephenoxy)-3,5-dimethyl-α,α-dimethylbenzyl]benzene, 1,3-bis[4-(4-maleimidephenoxy)-3,5-dimethyl-α,α-dimethylbenzyl]benzene, 1,4-bis[4-(3-maleimidephenoxy)-3,5-dimethyl-α,α-dimethylbenzyl]benzene, 1,3-bis[4-(3-maleimidephenoxy)-3,5-dimethyl-α,α-dimethylbenzyl]benzene, and polyphenylmethanemaleimide.

Among these, from the viewpoint of high reactivity and advanced heat resistance, bis(4-maleimidephenyl)methane, bis(4-maleimidephenyl)sulfone, bis(4-maleimidephenyl)sulfide, bis(4-maleimidephenyl)disulfide, N,N'-(1,3-phenylene)bismaleimide, and 2,2-bis[4-(4-maleimidephenoxy)phenyl]propane are preferable, and from the viewpoint of inexpensiveness, bis(4-maleimidephenyl)methane and N,N'-(1,3-phenylene)bismaleimide are preferable.

The maleimide compound (A) is preferably a compound obtained by reacting the maleimide compound (a1) with one or more selected from the group consisting of a monoamine compound (a2) and a diamine compound (a3) (hereinafter also referred to as "modified maleimide compound"), and more preferably a compound obtained by reacting the maleimide compound (a1) with a monoamine compound (a2) and a diamine compound (a3), or a compound obtained by reacting the maleimide compound (a1) with a diamine compound (a3).

(Monoamine Compound (a2))

The monoamine compound (a2) is not particularly limited as long as it is a compound having one amino group, but is preferably a monoamine compound having an acidic substituent, and more preferably a monoamine compound represented by the following general formula (a2-1), from the viewpoint of high heat resistance, low relative permittivity, high copper foil adhesion, and the like.

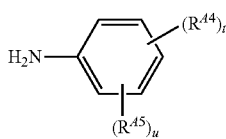

(a2-1)

In the formula, $R^{A4}$ represents an acidic substituent selected from a hydroxy group, a carboxy group, and a sulfonic acid group. $R^{A5}$ represents an alkyl group having 1 to 5 carbon atoms or a halogen atom. t is an integer of 1 to 5, u is an integer of 0 to 4, and 1≤t+u≤5 is satisfied. However, when t is an integer of 2 to 5, plural $R^{A4}$'s may be the same or different. Further, when u is an integer of 2 to 4, plural $R^{A5}$'s may be the same or different.

The acidic substituent represented by $R^{A4}$ is, from the viewpoint of solubility and reactivity preferably a hydroxy group or a carboxy group, and is, also in consideration of heat resistance, more preferably a hydroxy group.

t represents an integer of 1 to 5, and from the viewpoint of high heat resistance, low relative permittivity, high copper foil adhesion, and the like, preferably an integer of 1 to 3, more preferably 1 or 2, and still more preferably 1.

Examples of the alkyl group having 1 to 5 carbon atoms, as represented by $R^{A5}$, include a methyl group, an ethyl group, an n-propyl group, an isopropyl group, an n-butyl group, an isobutyl group, a t-butyl group, and an n-pentyl group. The alkyl group is preferably an alkyl group having 1 to 3 carbon atoms.

Examples of the halogen atom, as represented by $R^{A5}$, include a fluorine atom, a chlorine atom, a bromine atom, and an iodine atom.

u represents an integer of 0 to 4, and from the viewpoint of high heat resistance, low relative permittivity, high copper foil adhesion, and the like, preferably an integer of 0 to 3, more preferably an integer of 0 to 2, still more preferably 0 or 1, and particularly preferably 0.

Examples of the monoamine compound (a2) include o-aminophenol, m-aminophenol, p-aminophenol, o-aminobenzoic acid, m-aminobenzoic acid, p-aminobenzoic acid, o-aminobenzenesulfonic acid, m-aminobenzenesulfonic acid, p-aminobenzenesulfonic acid, 3,5-dihydroxyaniline, and 3,5-dicarboxyaniline. Among these, from the viewpoint of heat resistance, o-aminophenol, m-aminophenol, and p-aminophenol are preferable, and also in consideration of dielectric characteristics, low thermal expansion, and production cost, p-aminophenol is more preferable.

One of the monoamine compounds (a2) may be used singly or two or more thereof may be used in combination.

(Diamine Compound (a3))

The diamine compound (a3) is not particularly limited as long as it is a compound having two amino groups, but is preferably a diamine compound represented by the following general formula (a3-1) and a modified siloxane compound having an amino group at a molecular terminal, which will be described later, from the viewpoint of high heat resistance, low relative permittivity, high copper foil adhesion, and the like.

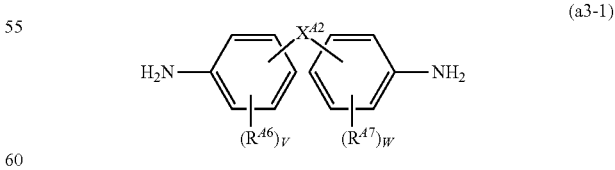

(a3-1)

In the formula, $X^{A2}$ represents an aliphatic hydrocarbon group having 1 to 3 carbon atoms or —O—. $R^{A6}$ and $R^{A7}$ each independently represent an alkyl group having 1 to 5 carbon atoms, a halogen atom, a hydroxy group, a carboxy group, or a sulfonic acid group. v and w each independently represent an integer of 0 to 4.

Examples of the aliphatic hydrocarbon group having 1 to 3 carbon atoms, as represented by $X^{42}$, include a methylene group, an ethylene group, a propylene group, and a propylidene group.

$X^{42}$ is preferably a methylene group.

Examples of the alkyl group having 1 to 5 carbon atoms, as represented by $R^{46}$ and $R^{47}$, include a methyl group, an ethyl group, an n-propyl group, an isopropyl group, an n-butyl group, an isobutyl group, a t-butyl group, and an n-pentyl group. The alkyl group is preferably an alkyl group having 1 to 3 carbon atoms.

v and w each are preferably an integer of 0 to 2, more preferably 0 or 1, and still more preferably 0.

Examples of the modified siloxane compound having an amino groups at the molecular terminal include a diamine compound represented by the following general formula (a3-2).

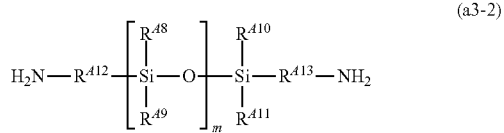
(a3-2)

In the formula, $R^{48}$ to $R^{411}$ each independently represent an alkyl group having 1 to 5 carbon atoms, a phenyl group, or a phenyl group having a substituent. $R^{412}$ and $R^{413}$ each independently represent a divalent organic group, and m represents an integer of 2 to 100.

Examples of the alkyl group having 1 to 5 carbon atoms, as represented by $R^{48}$ to $R^{411}$, include a methyl group, an ethyl group, an n-propyl group, an isopropyl group, an n-butyl group, an isobutyl group, a t-butyl group, and an n-pentyl group. The alkyl group is preferably an alkyl group having 1 to 3 carbon atoms, and more preferably a methyl group.

Examples of the substituent in the phenyl group having a substituent include an alkyl group having 1 to 5 carbon atoms, an alkenyl group having 2 to 5 carbon atoms, and an alkynyl group having 2 to 5 carbon atoms. Examples of the alkyl group having 1 to 5 carbon atoms are the same as those described above. Examples of the alkenyl group having 2 to 5 carbon atoms include a vinyl group and an allyl group. Examples of the alkynyl group having 2 to 5 carbon atoms include an ethynyl group and a propargyl group.

Examples of the divalent organic group represented by $R^{412}$ and $R^{413}$ include an alkylene group, an alkenylene group, an alkynylene group, an arylene group, —O—, or a divalent linking group formed by combining these groups. Examples of the alkylene group include an alkylene group having 1 to 10 carbon atoms such as a methylene group, an ethylene group, and a propylene group. Examples of the alkenylene group include an alkenylene group having 2 to 10 carbon atoms. Examples of the alkynylene group include an alkynylene group having 2 to 10 carbon atoms. Examples of the arylene group include an arylene group having 6 to 20 carbon atoms such as a phenylene group and a naphthylene group.

Among these, $R^{412}$ and $R^{413}$ are preferably an alkylene group or an arylene group.

m is preferably an integer of 2 to 50, more preferably an integer of 3 to 40, and still more preferably an integer of 5 to 30.

Specifically examples of the diamine compound (a3) include 4,4'-diaminodiphenylmethane, 4,4'-diaminodiphenylethane, 4,4'-diaminodiphenylpropane, 2,2'-bis(4,4'-diaminodiphenyl)propane, 3,3'-dimethyl-4,4,'-diaminodiphenylmethane, 3,3'-diethyl-4,4'-diaminodiphenylmethane, 3,3'-dimethyl-4,4'-diaminodiphenylethane, 3,3'-diethyl-4,4'-diaminodiphenylethane, 4,4'-diaminodiphenyl ether, 4,4'-diaminodiphenyl thioether, 3,3'-dihydroxy-4,4'-diaminodiphenylmethane, 2,2',6,6'-tetramethyl-4,4'-diaminodiphenylmethane, 3,3'-dichloro-4,4'-diaminodiphenylmethane, 3,3'-dibromo-4,4'-diaminodiphenylmethane, 2,2',6,6'-tetrachloro-4,4'-diaminodiphenylmethane, 2,2',6,6'-tetrabromo-4,4'-diaminodiphenylmethane, and the modified siloxane compounds having an amino group at a molecular terminal described above. Among these, from the viewpoint of inexpensiveness, 4,4'-diaminodiphenylmethane, 3,3'-diethyl-4,4'-diaminodiphenylmethane, and the modified siloxane compounds having an amino group at a molecular terminal are preferable.

One of the diamine compounds (a3) may be used singly or two or more thereof may be used in combination.

The reaction of the maleimide compound (a1) with one or more selected from the group consisting of the monoamine compound (a2) and the diamine compound (a3) is preferably carried out by reacting them in the presence of an organic solvent at a reaction temperature of 70 to 200° C. for 0.1 to 10 hours. The reaction temperature is more preferably 70 to 160° C., still more preferably 70 to 130° C., and particularly preferably 80 to 120° C.

The reaction time is more preferably 1 to 8 hours, and still more preferably 2 to 6 hours.

In the reaction of the component (a1) with one selected from the group consisting of the component (a2) and the component (a3) in the production of the modified maleimide compound, the amounts used of the three components are preferably such that the relationship between the sum total of the —NH$_2$ group equivalent (primary amino group equivalent) of one or more selected from the group consisting of the component (a2) and the component (a3) and the maleimide group equivalent of the component (a1) satisfies the following formula:

$$0.1 \leq \text{[maleimide group equivalent]/[sum total of —NH}_2 \text{ group equivalent]} \leq 10$$

By setting [maleimide group equivalent]/[sum total of —NH2 group equivalent] to 0.1 or more, gelation and decrease in heat resistance are suppressed, and by setting the ratio to 10 or less, solubility in organic solvent, copper foil adhesion, and heat resistance are improved.

From the same viewpoint, the amounts of the three components used more preferably satisfy the following formula:

$$1 \leq \text{[maleimide group equivalent]/[sum total of —NH}_2 \text{ group equivalent]} \leq 9$$

and still more preferably satisfy the following formula:

$$2 \leq \text{[maleimide group equivalent]/[sum total of —NH}_2 \text{ group equivalent]} \leq 8.$$

When the modified maleimide compound is a compound obtained by reacting the component (a1), the component (a2), and the component (a3), the ratio (molar ratio) of the structural unit derived from the component (a2) to the structural unit derived from the component (a3) is preferably 0.9 to 5.0, more preferably 1.0 to 4.5, and still more preferably 1.0 to 4.0.

The weight average molecular weight (Mw) of the modified maleimide compound is preferably 400 to 3,500, more preferably 600 to 2,000, and still more preferably 800 to 1,500.

The weight average molecular weight (Mw) in this description is a value measured according to a gel permeation chromatography (GPC) method (standard polystyrene-equivalent conversion value) using tetrahydrofuran as an eluent, and is more specifically a value measured according to the method described in the section of Examples.

[(B) Epoxy Resin]

Examples of the epoxy resin (B) include glycidyl ether type epoxy resins, glycidylamine type epoxy resins, and glycidyl ester type epoxy resins. Among these, glycidyl ether type epoxy resins are preferable.

The epoxy resin (B) can be classified into various kinds of epoxy resins depending on the difference in the main skeleton. The epoxy resins of the above-mentioned types can be further grouped into bisphenol type epoxy resins such as bisphenol A type epoxy resins, bisphenol F type epoxy resins, and bisphenol S type epoxy resins; novolak type epoxy resins such as biphenyl aralkyl novolak type epoxy resins, phenol novolak type epoxy resins, alkylphenol novolak type epoxy resins, cresol novolak type epoxy resins, naphtholalkylphenol copolymerized novolak type epoxy resins, naphtholaralkylcresol copolymerized novolak type epoxy resins, bisphenol A novolak type epoxy resins, and bisphenol F novolak type epoxy resins; stilbene type epoxy resins; triazine skeleton-containing epoxy resins; fluorene skeleton-containing epoxy resins; naphthalene type epoxy resins; anthracene type epoxy resins; triphenylmethane type epoxy resins; biphenyl type epoxy resins; xylylene type epoxy resins; and alicyclic epoxy resins such as dicyclopentadiene type epoxy resins.

One of the epoxy resins (B) may be used singly or two or more thereof may be used in combination.

The epoxy equivalent of the epoxy resin (B) is preferably 100 to 500 g/eq, more preferably 120 to 400 g/eq, still more preferably 140 to 300 g/eq, and particularly preferably 170 to 240 g/eq.

Here, the epoxy equivalent is a mass of resin per epoxy group (g/eq), and can be measured according to the method defined in JIS K 7236 (2001). Specifically using an automatic titrator manufactured by Mitsubishi Chemical Analytech Co., Ltd. "GT-200 Model", 2 g of an epoxy resin is metered in a 200-mL beaker, 90 mL of methyl ethyl ketone is dropwise added thereto to dissolve the epoxy resin therein with an ultrasonic washer, and 10 mL of glacial acetic acid and 1.5 g of cetyltrimethylammonium bromide are added, and the resultant solution is titrated with a solution of 0.1 mol/L perchloric acid/acetic acid to thereby determine the epoxy equivalent of the resin.

[(C) Specific Copolymer Resin]

The component (C) is a copolymer resin having a structural unit derived from a substituted vinyl compound and a structural unit derived from a maleic anhydride (hereinafter also referred to as a "copolymer resin (C)").

Examples of the substituted vinyl compound include an aromatic vinyl compound, an aliphatic vinyl compound, and a functional group-substituted vinyl compound. Examples of the aromatic vinyl compound include styrene, 1-methylstyrene, vinyltoluene, and dimethylstyrene. Examples of the aliphatic vinyl compound include propylene, butadiene, and isobutylene. Examples of the functional group-substituted vinyl compound include acrylonitrile and a compound having a (meth)acryloyl group such as methyl acrylate and methyl methacrylate. Among these, aromatic vinyl compounds are preferable, and styrene is more preferable.

As the component (C), a copolymer resin having a structural unit represented by the following general formula (C-i) as a structural unit derived from a substituted vinyl compound and a structural unit represented by the following formula (C-ii) as a structural unit derived from a maleic anhydride is preferable.

One of the components (C) may be used singly or two or more thereof may be used in combination.

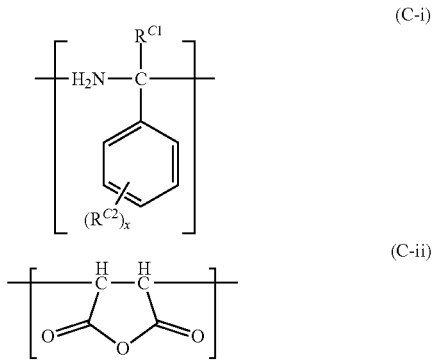

In the formula, $R^{C1}$ represents a hydrogen atom, or an alkyl group having 1 to 5 carbon atoms, $R^{C2}$ represents an alkyl group having 1 to 5 carbon atoms, an alkenyl group having 2 to 5 carbon atoms, an aryl group having 6 to 20 carbon atoms, a hydroxy group, or a (meth)acryloyl group, and x represents an integer of 0 to 3, provided that when x is 2 or 3, plural $R^{C2}$'s may be the same or different.

Examples of the alkyl group having 1 to 5 carbon atoms, as represented by $R^{C1}$ and $R^{C2}$, include a methyl group, an ethyl group, an n-propyl group, an isopropyl group, an n-butyl group, an isobutyl group, a t-butyl group, and an n-pentyl group. The alkyl group is preferably an alkyl group having 1 to 3 carbon atoms.

Examples of the alkenyl group having 2 to 5 carbon atoms, as represented by $R^{C2}$ include an allyl group and a crotyl group. The alkenyl group is preferably an alkenyl group having 3 or 4 carbon atoms.

Examples of the aryl group having 6 to 20 carbon atoms, as represented by $R^{C2}$, include a phenyl group, a naphthyl group, an anthryl group, and a biphenylyl group. The aryl group is preferably an aryl group having 6 to 10 carbon atoms. x is preferably 0 or 1, and more preferably 0.

The content ratio of the structural unit derived from a substituted vinyl compound to the structural unit derived from a maleic anhydride [(structural unit derived from a substituted vinyl compound)/(structural unit derived from a maleic anhydride)](molar ratio) in the copolymer resin (C) is preferably 1 to 9, more preferably 2 to 9, and still more preferably 3 to 8. When the content ratio is equal to or greater than the lower limit value, the effect of improving dielectric characteristics tends to be sufficient, and when the content ratio is equal to or less than the upper limit value, miscibility with other resin components tends to be favorable.

In the copolymer resin (C), the total content of the structural unit derived from a substituted vinyl compound and the structural unit derived from a maleic anhydride is preferably 50% by mass or more, more preferably 70% by mass or more, still more preferably 90% by mass or more, and particularly preferably substantially 100% by mass.

The weight average molecular weight (Mw) of the copolymer resin (C) is preferably 4,500 to 18,000, more preferably 6,000 to 17,000, still more preferably 8,000 to 16,000, and particularly preferably 8,000 to 15,000.

[(D) Inorganic Filler]

The thermosetting resin composition may further contain an inorganic filler (D).

Examples of the inorganic filler (D) include silica, alumina, titanium oxide, mica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clay such as calcined clay talc, aluminum borate, silicon carbide, quartz powder, short glass fiber, fine glass powder, and hollow glass. Examples of the glass include E glass, T glass, and D glass.

One of the inorganic fillers (D) may be used singly or two or more thereof may be used in combination.

Among these, silica is preferable from the viewpoint of dielectric characteristics, heat resistance, and low thermal expansion. Examples of the silica include a precipitated silica produced by a wet process and having a high water content, and dry process silica produced by a dry process and hardly containing bound water and the like, and the dry process silica is further classified into crushed silica, fumed silica, fused spherical silica, and the like depending on the difference in production method. Among these, fused spherical silica is preferable from the viewpoint of low thermal expansion and flowability when filled in a resin.

The average particle diameter of the inorganic filler (D) is preferably 0.1 to 10 μm, more preferably 0.3 to 8 μm, and still more preferably 0.5 to 2 μm. When the average particle diameter is 0.1 μm or more, it is possible to favorably maintain the flowability when the resin is highly filled, and when the average particle diameter is 10 μm or less, it is possible to reduce the mixing probability of coarse particles and to suppress the occurrence of defects caused by coarse particles. Here, the average particle diameter in the present invention is a particle size at a point corresponding to 50% volume on a cumulative frequency distribution curve of particle size drawn with the total volume of particles as 100%, and can be measured using a particle sizer or the like according to a laser diffraction scattering method.

The use of silica treated with an aminosilane coupling agent as the inorganic filler (D) is preferable because low thermal expansion is improved, and adhesion of silica to the components (A) to (C) is improved to suppress dropping off of silica, and thus the effect of suppressing deformation of laser via shape due to excessive desmearing is obtained.

The aminosilane coupling agent may have one amino group, or may have two amino groups, or three or more amino groups. In general, the aminosilane coupling agent has one or two amino groups.

Examples of the aminosilane coupling agent having one amino group include 3-aminopropyltrimethoxysilane, 3-aminopropyltriethoxysilane, N-phenyl-3-aminopropyltrimethoxysilane, 3-triethoxysilyl-N-(1,3-dimethyl-butylidene)propylamine, and 2-propynyl[3-(trimethoxysilyl)propyl]carbamate.

Examples of the aminosilane coupling agent having two amino groups include N-2-(aminoethyl)-3-aminopropylmethyldimethoxysilane, N-2-(aminoethyl)-3-aminopropyltrimethoxysilane, 1-[3-(trimethoxysilyl)propyl]urea, and 1-[3-(triethoxysilyl)propyl]urea.

One of the aminosilane coupling agents may be used singly or two or more thereof may be used in combination.

[(E) Curing Agent]

The thermosetting resin composition may further contain a curing agent (E). Examples of the curing agent (E) include dicyandiamide; linear aliphatic amines except dicyandiamide, such as ethylenediamine, diethylenetriamine, triethylenetetramine, tetraethylenepentamine, hexamethylenediamine, diethylaminopropylamine, tetramethylguanidine, and triethanolamine; cyclic aliphatic amines such as isophoronediamine, diaminodicyclohexylmethane, bis(aminomethyl)cyclohexane, bis(4-amino-3-methyldicyclohexyl) methane, N-aminoethylpiperazine, and 3,9-bis(3-aminopropyl)-2,4,8,10-tetraoxaspiro[5.5]undecane; aromatic amines such as xylenediamine, phenylenediamine, diaminodiphenylmethane, and diaminodiphenyl sulfone.

One of the curing agents (E) may be used singly or two or more thereof may be used in combination.

[(F) Thermoplastic Elastomer]

The thermosetting resin composition may further contain a thermoplastic elastomer (F).

Examples of the thermoplastic elastomer (F) include a styrene elastomer, an olefin elastomer, a urethane elastomer, a polyester elastomer, a polyamide elastomer, an acrylic elastomer, a silicone elastomer, and derivatives thereof. Among these, a styrene elastomer is preferable.

One of the thermoplastic elastomers (F) may be used singly or two or more thereof may be used in combination.

However, in the present embodiment, the definition of the thermoplastic elastomer (F) does not include the component (C).

The thermoplastic elastomer (F) preferably has a reactive functional group at a molecular terminal or in a molecular chain. Examples of the reactive functional group include an epoxy group, a hydroxy group, a carboxy group, an amino group, an amide group, an isocyanate group, an acrylic group, a methacrylic group, and a vinyl group. By having these reactive functional groups at the molecular terminal or in the molecular chain, miscibility with other resin components is improved, and heat resistance of the substrate can be improved. Among these reactive functional groups, a carboxy group, an amino group, and a hydroxy group are preferable from the viewpoint of adhesion to a copper foil.

Examples of the styrene elastomer include a styrene-butadiene copolymer such as a styrene-butadiene-styrene block copolymer; a styrene-isoprene copolymer such as a styrene-isoprene-styrene block copolymer; a styrene-ethylene-butylene-styrene block copolymer; and a styrene-ethylene-propylene-styrene block copolymer. As the raw material monomer of the styrene elastomer, styrene derivatives such as α-methylstyrene, 3-methylstyrene, 4-propylstyrene, and 4-cyclohexylstyrene can be used in addition to styrene. Among these, a styrene-butadiene copolymer and a styrene-isoprene copolymer are preferable, and hydrogenated styrene-based thermoplastic elastomers such as a hydrogenated styrene-butadiene copolymer resin and a hydrogenated styrene-isoprene copolymer resin, obtained by hydrogenating the double bond portion of these copolymers are more preferable.

[(G) Curing Accelerator]

The thermosetting resin composition may further contain a curing accelerator (G) from the viewpoint of accelerating the curing reaction.

Examples of the curing accelerator (G) include organo-phosphorus compounds such as triphenylphosphine; imidazoles and derivatives thereof; nitrogen-containing compounds such as secondary amines, tertiary amines, and quaternary ammonium salts; organic peroxides such as dicumyl peroxide, 2,5-dimethyl-2,5-bis(t-butylperoxy) hexyne-3, 2,5-dimethyl-2,5-bis(t-butylperoxy)hexane, and α,α'-bis(t-butylperoxy)diisopropylbenzene; and organometallic salts such as zinc naphthenate, cobalt naphthenate, tin octylate, and cobalt octylate. Among these, organic phosphorus compounds are preferable.

One of the curing accelerators (G) may be used singly or two or more thereof may be used in combination.

(Content of Each Component in Thermosetting Resin Composition)

The content of each component in the thermosetting resin composition is not particularly limited, and can be, for example, in the range described below.

When the thermosetting resin composition contains the component (A), the content thereof is preferably 10 to 90 parts by mass, more preferably 20 to 85 parts by mass, and still more preferably 40 to 80 parts by mass, with respect to 100 parts by mass of the total amount of the resin components contained in the thermosetting resin composition. When the content of the component (A) is equal to or greater than the lower limit value, heat resistance, relative permittivity, glass transition temperature, and low thermal expansion tend to be excellent. On the other hand, when the content is equal to or less than the upper limit value, flowability and moldability tend to be excellent.

When the thermosetting resin composition contains the component (B), the content thereof is preferably 5 to 50 parts by mass, more preferably 10 to 40 parts by mass, and still more preferably 20 to 35 parts by mass, with respect to 100 parts by mass of the total amount of the resin components contained in the thermosetting resin composition. When the content of the component (B) is equal to or greater than the lower limit value, heat resistance, glass transition temperature, and low thermal expansion tend to be excellent. On the other hand, when the content is equal to or lower than the upper limit value, heat resistance, relative permittivity, glass transition temperature, and low thermal expansion tend to be excellent.

When the thermosetting resin composition contains the component (C), the content thereof is preferably 2 to 40 parts by mass, more preferably 5 to 35 parts by mass, and still more preferably 10 to 30 parts by mass, with respect to 100 parts by mass of the total amount of the resin components contained in the thermosetting resin composition. When the content of the component (C) is equal to or greater than the lower limit value, heat resistance and relative permittivity tend to be excellent. On the other hand, when the content is equal to or lower than the upper limit value, heat resistance, copper foil adhesion, and low thermal expansion tend to be excellent.

When the thermosetting resin composition contains the component (D), the content thereof is preferably 30 to 200 parts by mass, more preferably 40 to 150 parts by mass, and still more preferably 45 to 120 parts by mass, with respect to 100 parts by mass of the total amount of the resin components contained in the thermosetting resin composition. When the content of the component (D) is equal to or greater than the lower limit value, low thermal expansion tends to be excellent. On the other hand, when the content is equal to or less than the upper limit value, heat resistance, flowability, and moldability tend to be excellent.

When the thermosetting resin composition contains the component (E), the content thereof is preferably 0.1 to 10 parts by mass, more preferably 0.5 to 5 parts by mass, and still more preferably 1 to 3 parts by mass, with respect to 100 parts by mass of the total amount of the resin components contained in the thermosetting resin composition. When the content of the component (E) is equal to or greater than the lower limit value, copper foil adhesion and low thermal expansion tend to be excellent. On the other hand, when the content is equal to or less than the upper limit value, heat resistance tends to be excellent.

When the thermosetting resin composition contains the component (F), the content thereof is preferably 2 to 30 parts by mass, more preferably 5 to 20 parts by mass, and still more preferably 7 to 15 parts by mass, with respect to 100 parts by mass of the total amount of the resin components contained in the thermosetting resin composition. When the content of the component (F) is equal to or greater than the lower limit value, relative permittivity tends to be excellent. On the other hand, when the content is equal to or lower than the upper limit value, heat resistance and copper foil adhesion tend to be excellent.

When the thermosetting resin composition contains the component (G), the content thereof is preferably 0.05 to 5 parts by mass, more preferably 0.1 to 3 parts by mass, and still more preferably 0.2 to 1 part by mass, with respect to 100 parts by mass of the total amount of the resin components contained in the thermosetting resin composition.

Other Components

The thermosetting resin composition may further contain other components such as a flame retardant, a colorant, an antioxidant, a reducing agent, an ultraviolet absorber, a fluorescent brightener, an adhesion improver, and an organic filler, as long as the effects of the present invention are not impaired. One of these components may be used singly or two or more thereof may be used in combination.

[Method for Producing Prepreg]

When the insulating layer is formed by curing a prepreg, the prepreg can be produced, for example, by impregnating or coating the sheet-shaped reinforcing substrate with the thermosetting resin composition and semicuring the composition by heating or the like (for conversion into B-stage).

When the sheet-shaped reinforcing substrate is impregnated or coated with the thermosetting resin composition, the thermosetting resin composition may be in a state of varnish diluted with an organic solvent such as methyl ethyl ketone. The concentration of non-volatile components in the varnish is, for example, 40 to 80% by mass, and preferably 50 to 75% by mass.

The drying conditions after impregnation are not particularly limited, but the heating temperature is, for example, 120 to 200° C., preferably 140 to 180° C., and the heating time is, for example, 30 seconds to 30 minutes, preferably 1 to 10 minutes.

As the sheet-shaped reinforcing substrate for the prepreg, any well-known one that is used in laminates for various electric insulating materials can be used. Examples of the material of the sheet-shaped reinforcing substrate include natural fibers such as paper and cotton linter; inorganic fibers such as glass fibers and asbestos; organic fibers such as aramid, polyimide, polyvinyl alcohol, polyester, tetrafluoroethylene, and acrylic; and mixtures thereof. Among these, glass fibers are preferable from the viewpoint of flame retardancy. Examples of the glass fiber substrate include a glass cloth using E glass, C glass, D glass, S glass, or the like, or a glass cloth obtained by bonding short fibers with an organic binder; and a mixture of glass fibers and cellulose fibers. Among these, glass cloth using E glass is preferable.

These sheet-shaped reinforcing substrates have various shapes of, for example, woven fabric, nonwoven fabric, roving, chopped strand mat, and surfacing mat. The material and the shape can be selected depending on the use and the performance of the intended molded article, and one alone or, as needed, two or more kinds of materials and shapes can be used either singly or as combined.

The thickness of the prepreg is preferably 0.01 to 0.5 mm, more preferably 0.02 to 0.3 mm, and still more preferably 0.05 to 0.2 mm, from the viewpoint of moldability and enabling high-density wiring.

The thickness of the insulating layer included in the copper-clad laminate is preferably 0.01 to 0.5 mm, more preferably 0.02 to 0.3 mm, and still more preferably 0.05 to 0.2 mm, from the viewpoint of moldability and enabling high-density wiring.

[Method for Producing Copper-Clad Laminate]

The method for producing a copper-clad laminate of the present embodiment is a method for producing a copper-clad laminate, in which the insulating layer is a layer obtained by curing a prepreg containing a thermosetting resin, and the method includes heating the prepreg or the insulating layer obtained by curing the prepreg and the surface-treated copper foil (I) at 210° C. or higher in a state where the prepreg or the insulating layer and the surface-treated copper foil (I) are bonded to each other.

The "step of heating at 210° C. or higher" means that the product temperature (that is, the laminate obtained by bonding the insulating layer and the surface-treated copper foil (I)) is 210° C. or higher. In order to set the product temperature to 210° C. or higher, for example, the heating device to be used may be set to 210° C. or higher.

The heating temperature in the heating step is more preferably 215° C. or higher, and still more preferably 220° C. or higher, from the viewpoint of improving productivity. In addition, the heating temperature is preferably 300° C. or lower, and more preferably 250° C. or lower, from the viewpoint of causing a uniform curing reaction.

Regarding the molding condition for the laminate, any known molding method for laminates and multilayer plates for electric insulating materials may be employed. As the molding machine, for example, a multistage press, a multistage vacuum press, a continuous molding machine, an autoclave molding machine or the like may be used for molding under the conditions of a pressure of 0.2 to 10 MPa and a heating time of 0.1 to 5 hours at the above-mentioned heating temperature.

[Printed Wiring Board]

The printed wiring board of the present embodiment is a printed wiring board using the copper-clad laminate of the present embodiment.

The printed wiring board of the present embodiment can be produced by subjecting the copper foil of the copper-clad laminate to circuit processing. The circuit processing can be performed by, for example, forming a resist pattern on the surface of the copper foil, removing unnecessary portions of the copper foil by etching, removing the resist pattern, forming necessary through holes by drilling, forming a resist pattern again, performing plating for electroconduction to the through holes, and finally removing the resist pattern. The step of laminating a copper-clad laminate on the surface of the obtained printed wiring board under the same conditions as described above and the step of circuit processing are repeated a required number of times to obtain a multilayer printed wiring board.

[Semiconductor Package]

The semiconductor package of the present embodiment includes a semiconductor element mounted on the printed wiring board of the present embodiment. The semiconductor package of the present embodiment can be manufactured by mounting a semiconductor chip, a memory and the like at a predetermined position of the printed wiring board of the present embodiment.

EXAMPLES

Next, the present invention will be described in more detail with reference to the following examples, but these examples are not intended to limit the present invention in any way.

[Evaluation Methods]

<Blister Resistance>

Using a four-layered copper-clad laminate produced in each Example, the highest achieving temperature was set to 266° C., the four-layered copper-clad laminate was allowed to flow for 50 seconds in a constant temperature bath environment of 260° C. or higher as one cycle, the number of cycles until the occurrence of blisters was visually confirmed was determined, and evaluation was performed based on the following criteria. A larger number of cycles indicates more excellent heat resistance.

(Evaluation Criteria)
A: More than 20 times
B: More than 15 times and 20 times or less
C: More than 5 times and 15 times or less
D: More than 3 times and 5 times or less
E: 2 times or more and 3 times or less
F: 1 time or less Production Example 1

(Preparation of Prepreg A)

In preparing the prepreg A, the following components were prepared.

Component (A): a solution of a maleimide compound produced by the following method 19.2 g of 4,4'-diaminodiphenylmethane, 174.0 g of bis(4-maleimidephenyl)methane, 6.6 g of p-aminophenol, and 330.0 g of dimethylacetamide were put in a reactor equipped with a thermometer, a stirrer and a water metering device with a reflux condenser tube and having a volume of 1 L, and reacted therein at 100° C. for 2 hours to give a dimethylacetamide solution of a maleimide compound having an acidic substituent and an N-substituted maleimide group (Mw=1,370) as a modified maleimide compound. This was used as the component (A).

The weight average molecular weight (Mw) was determined through gel permeation chromatography (GPC) with a standard polystyrene-equivalent calibration curve. The calibration curve was approximated in a cubic equation using standard polystyrene: TSK standard POLYSTYRENE (Type: A-2500, A-5000, F-1, F-2, F-4, F-10, F-20, F-40) (manufactured by Tosoh Corporation). The GPC condition is shown below.

Apparatus: (Pump: Model: L-6200 [manufactured by Hitachi High-Tech Corporation]),
(Detector: Model: L-3300 RI [manufactured by Hitachi High-Tech Corporation]),
(Column oven: L-655A-52 [manufactured by Hitachi High-Tech Corporation])
Columns: TSKgel Super HZ2000+TSKgel Super HZ2300 (all manufactured by Tosoh Corporation)
Column Size: 6.0×40 mm (guard column), 7.8×300 mm (column)
Eluent: tetrahydrofuran
Sample Concentration: 20 mg/5 mL Injection Amount: 10 μL
Flow Rate: 0.5 mL/min
Measurement Temperature: 40° C.
Component (B): Cresol novolak type epoxy resin "EPI-CLON (registered trademark) N-673" (manufactured by DIC Corporation)
Component (C): "SMA (registered trademark) EF40" (styrene/maleic anhydride molar ratio=4, Mw=11,000, manufactured by Cray Valley Corporation)
Component (D): Fused silica treated with an aminosilane coupling agent, average particle diameter: 1.9 μm, specific surface area: 5.8 m$^2$/g
Component (E): Dicyandiamide Next, 45 parts by mass of the component (A), 30 parts by mass of the component (B), 25 parts by mass of the component (C), 50 parts by mass of the component (D) with respect to 100 parts by mass of the total amount of the resin components [the sum total of the components (A) to (C)], and 2 parts by mass of the component (E) with respect to 100 parts by mass of the total amount of the resin components described above were blended, and methyl ethyl ketone was further added so that the non-volatile content of the solution was 67% by mass to prepare a resin varnish. The blending amount of each component described above is a part by mass of a solid content, and in the case of a solution (excluding an organic solvent) or a dispersion, the blending amount is an amount in terms of a solid content.

The resultant resin varnish was impregnated into a glass cloth (thickness: 0.1 mm) of IPC Standard #3313, and dried at 160° C. for 4 minutes to obtain prepreg A.

Production Example 2

(Preparation of Prepreg B)

In preparing the prepreg B, the following components were prepared.

Component (A): a solution of a modified maleimide compound produced by the following method In a reactor capable of heating and cooling equipped with a thermometer, a stirrer, and a water metering device with a reflux condenser tube and having a volume of 2 L, 15.9 g of diamine-modified siloxane at both ends (trade name: X-22-161A, manufactured by Shin-Etsu Chemical Co., Ltd.), 28.6 g of 3,3'-diethyl-4,4'-diaminodiphenylmethane, 280.5 g of bis(4-maleimidophenyl)methane, and 200.0 g of propylene glycol monomethyl ether were added and reacted at 126° C. for 5 hours under reflux to obtain a solution of a modified maleimide compound.

Component (C): "SMA (registered trademark) EF80" (styrene/maleic anhydride molar ratio=8, manufactured by Sartomer)
Component (D): Spherical fused silica (average particle diameter: 0.5 μm)
Component (F): "Tuftec M1913" (carboxylic acid modified hydrogenated styrene-butadiene copolymer resin) (styrene amount: 30% by mass) (manufactured by Asahi Kasei Chemicals Corporation)
Component (G): Tetraphenylphosphonium Tetra-p-tolylborate
Component (H): PX-200: aromatic phosphate (phosphorus content: 9% by mass) (manufactured by Daihachi Chemical Industry Co., Ltd.)

80 parts by mass of the component (A), 10 parts by mass of the component (C), 10 parts by mass of the component (F), 2 parts by mass of the component (H) with respect to 100 parts by mass of the total amount of the resin components [the sum total of the component (A), the component (C), and the component (F)], 0.5 parts by mass of the component (G) with respect to 100 parts by mass of the total amount of the resin components described above, and 100 parts by mass of the component (D) with respect to 100 parts by mass of the total amount of the resin components described above were blended, and toluene was further added so that the non-volatile content of the solution was 60% by mass to prepare a resin varnish. The blending amount of each component described above is a part by mass of a solid content, and in the case of a solution (excluding an organic solvent) or a dispersion, the blending amount is an amount in terms of a solid content.

The resultant resin varnish was impregnated into a glass cloth (thickness: 0.1 mm) of IPC Standard #3313, and dried at 160° C. for 4 minutes to obtain prepreg B.

Examples 1 to 7 and Comparative Examples 1 to 4

The prepregs produced in each production example and the copper foil shown in Table 1 were combined as shown in Table 2, and a four-layered copper-clad laminate was produced by the following method.

The copper foil shown in Table 1 is obtained by subjecting one surface thereof to heat resistance treatment, chromate treatment, and silane coupling agent treatment.

(Production of Four-Layered Copper-Clad Laminate)

The copper foil shown in Table 2 was laminated one by one on both sides of the prepreg (one sheet) shown in Table 2 so that the metal-treated layer was on the prepreg side, and the copper foil laminate was subjected to heating and press molding for 90 minutes under the conditions of a temperature of 225° C. and a pressure of 25 kgf/cm$^2$ (2.45 MPa) to produce a double-sided copper-clad laminate. Next, inner layer adhesion treatment (MULTIBOND 100 (manufactured by McDermid Performance Solutions Japan K.K.) treatment) was performed on the copper foil surfaces of both sides of the double-sided copper-clad laminate.

Subsequently the prepregs were stacked one by one on the copper foils on both sides of the double-sided copper-clad laminate, and further, the copper foils shown in Table 2 were stacked one by one on the prepregs such that the metal-treated layer was on the prepreg side. Thereafter, the copper-clad laminate was subjected to heating and press molding at a temperature of 225° C. and a pressure of 25 kgf/cm$^2$ (2.45 MPa) for 90 minutes to produce a four-layered copper-clad laminate. The four-layered copper-clad laminate was evaluated for blister resistance according to the method described above.

TABLE 1

| | Thickness | Content of each element in metal-treated layer (μg/dm$^2$) | | | |
|---|---|---|---|---|---|
| | (μm) | Zn | Ni | Co | Mo |
| Copper foil 1 | 12 | 110 | 150 | 0 | 0 |
| Copper foil 2 | 12 | 100 | 170 | 0 | 0 |
| Copper foil 3 | 12 | 40 | 0 | 250 | 130 |
| Copper foil 4 | 12 | 180 | 0 | 0 | 0 |
| Copper foil 5 | 12 | 100 | 210 | 0 | 0 |
| Copper foil 6 | 12 | 50 | 140 | 0 | 0 |
| Copper foil 7 | 12 | 2640 | 180 | 0 | 0 |
| Copper foil 8 | 12 | 4780 | 120 | 0 | 0 |
| Copper foil 9 | 12 | 3310 | 60 | 0 | 0 |

*The content of each element in the metal-treated layer is a value measured by fluorescent X-ray analysis (manufactured by Rigaku Corporation, trade name: ZSX Primus II).

TABLE 2

|  | Example | | | | | | | Comparative Example | | | |
| --- | --- | --- | --- | --- | --- | --- | --- | --- | --- | --- | --- |
|  | 1 | 2 | 3 | 4 | 5 | 6 | 7 | 1 | 2 | 3 | 4 |
| Type of Prepreg | A | A | A | A | A | A | B | A | A | A | B |
| Type of Copper foil | Copper foil 1 | Copper foil 2 | Copper foil 3 | Copper foil 4 | Copper foil 5 | Copper foil 6 | Copper foil 1 | Copper foil 7 | Copper foil 8 | Copper foil 9 | Copper foil 7 |
| Blister resistance | A | A | A | B | A | A | A | F | F | F | E |

Table 2 shows that the copper-clad laminates of Examples 1 to 7 using the surface-treated copper foil (I) of the present embodiment are excellent in blister resistance. On the other hand, the copper-clad laminates of Comparative Examples 1 to 4 using the copper foils having a zinc content exceeding 2,500 µg/dm$^2$ in the metal-treated layer had poor blister resistance.

The invention claimed is:

1. A copper-clad laminate comprising an insulating layer containing a resin and silica, and a copper foil arranged on at least one surface of the insulating layer,
    wherein the copper foil is a surface-treated copper foil having a metal-treated layer containing zinc and a second metal that is one or more metals selected from the group consisting of nickel and cobalt,
    a content of zinc in the metal-treated layer is 20 to 500 µg/dm$^2$,
    a ratio of a total content of the second metal/zinc is 1.2 to 5,
    a content of molybdenum in the metal-treated layer is 0 µg/dm$^2$, and
    a total content of second metal in the metal-treated layer is 60 to 500 µg/dm$^2$.

2. The copper-clad laminate according to claim 1, wherein the second metal comprises nickel, and a content of nickel in the metal-treated layer is 10 to 500 µg/dm$^2$.

3. The copper-clad laminate according to claim 1, wherein the surface-treated copper foil is obtained by subjecting one surface or both surfaces of a copper foil to heat resistance treatment, chromate treatment, and silane coupling agent treatment.

4. A method for producing the copper-clad laminate according to claim 1, wherein the insulating layer is a layer obtained by curing a prepreg containing a thermosetting resin, and the method comprises heating the prepreg or the insulating layer obtained by curing the prepreg and the surface-treated copper foil at 210° C. or higher in a state where the prepreg or the insulating layer obtained by curing the prepreg and the surface-treated copper foil are bonded to each other.

5. A printed wiring board comprising the copper-clad laminate according to claim 1.

6. A semiconductor package comprising a semiconductor element mounted on the printed wiring board according to claim 5.

7. The copper-clad laminate according to claim 1, wherein content of zinc in the metal-treated layer is 25 to 300 µg/dm$^2$.

8. The copper-clad laminate according to claim 1, wherein content of zinc in the metal-treated layer is 100 to 300 µg/dm$^2$.

9. The copper-clad laminate according to claim 1, wherein the insulating layer contains a cured product of a thermosetting resin composition or a cured product of a prepreg obtained by impregnating a sheet-shaped reinforcing substrate with a thermosetting resin composition.

10. The copper-clad laminate according to claim 9, wherein the thermosetting resin composition comprises at least one of a maleimide compound, an epoxy resin, a phenol resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, and a melamine resin.

11. The copper-clad laminate according to claim 9, wherein the thermosetting resin composition comprises a maleimide compound.

12. The copper-clad laminate according to claim 1, wherein the second metal consists of nickel.

* * * * *